US010012679B2

(12) United States Patent
Eken et al.

(10) Patent No.: US 10,012,679 B2
(45) Date of Patent: Jul. 3, 2018

(54) ENVELOPE DETECTOR WITH BIPOLAR TRIPLE-TAIL CELLS

(71) Applicant: HITTITE MICROWAVE LLC, Chelmsford, MA (US)

(72) Inventors: Yalcin Alper Eken, Istanbul (TR); Savas Tokmak, Istanbul (TR); Abdullah Celik, Istanbul (TR)

(73) Assignee: HITTITE MICROWAVE LLC, Chelmsford, MA (US)

( * ) Notice: Subject to any disclaimer, the term of this patent is extended or adjusted under 35 U.S.C. 154(b) by 0 days.

(21) Appl. No.: 15/461,233

(22) Filed: Mar. 16, 2017

(65) Prior Publication Data

US 2017/0248637 A1    Aug. 31, 2017

Related U.S. Application Data

(62) Division of application No. 13/225,904, filed on Sep. 6, 2011, now Pat. No. 9,625,498.

(60) Provisional application No. 61/383,820, filed on Sep. 17, 2010.

(51) Int. Cl.
| | | |
|---|---|---|
| H04B 17/00 | (2015.01) | |
| G01R 19/00 | (2006.01) | |
| G01R 19/04 | (2006.01) | |
| G01R 19/02 | (2006.01) | |
| H04B 17/30 | (2015.01) | |

(52) U.S. Cl.
CPC .............. *G01R 19/04* (2013.01); *G01R 19/02* (2013.01); *H04B 17/00* (2013.01); *H04B 17/30* (2015.01)

(58) Field of Classification Search
CPC ........ G01R 19/04; G01R 19/02; H04B 17/30; H04B 17/00
See application file for complete search history.

(56) References Cited

U.S. PATENT DOCUMENTS

| | | |
|---|---|---|
| 3,517,216 A | 6/1970 | Cope |
| 3,992,584 A | 11/1976 | Dugan |
| 4,047,235 A | 9/1977 | Davis |
| 4,156,848 A | 5/1979 | Stimple et al. |
| 4,758,793 A | 7/1988 | Sheade et al. |
| 4,823,807 A | 4/1989 | Russell et al. |
| 4,873,484 A | 10/1989 | Adam |

(Continued)

FOREIGN PATENT DOCUMENTS

| | | |
|---|---|---|
| CN | 2549652 Y | 5/2003 |
| CN | 101688889 A | 3/2010 |

(Continued)

OTHER PUBLICATIONS

Analog Devices, "ADL5502: 450 MHz to 6000 MHz Crest Factor Data Sheet", Rev. A., Jan. 2011, 28 pages. Available at: http://www.analog.com/media/en/technical-documentation/evaluation-documentation/ADL5502.pdf (accessed May 26, 2015).

(Continued)

*Primary Examiner* — Kenneth B Wells
(74) *Attorney, Agent, or Firm* — Knobbe, Martens, Olson & Bear, LLP

(57) ABSTRACT

Disclosed herein are power detectors and methods for detecting the average power level of an RF input signal and the voltage envelope of the RF input signal. Also disclosed herein are linear envelope detectors and methods for detecting the voltage envelope of an RF input signal.

20 Claims, 8 Drawing Sheets

(56) References Cited

U.S. PATENT DOCUMENTS

| | | | |
|---|---|---|---|
| 4,990,803 A | 2/1991 | Gilbert | |
| 5,077,541 A | 12/1991 | Gilbert | |
| 5,126,686 A | 6/1992 | Tam | |
| 5,220,276 A | 6/1993 | Kleefstra | |
| 5,268,601 A | 12/1993 | Cossins | |
| 5,274,582 A | 12/1993 | Whitby | |
| 5,298,811 A | 3/1994 | Gilbert | |
| 5,338,985 A | 8/1994 | Fotowat-Ahmady et al. | |
| 5,402,451 A | 3/1995 | Kaewell, Jr. et al. | |
| 5,432,478 A | 7/1995 | Gilbert | |
| 5,450,029 A | 9/1995 | Jacobs et al. | |
| 5,473,244 A | 12/1995 | Libove et al. | |
| 5,521,542 A * | 5/1996 | Kimura | G06G 7/24 327/351 |
| 5,608,409 A | 3/1997 | Rilling | |
| 5,668,750 A | 9/1997 | Kimura | |
| 5,684,431 A | 11/1997 | Gilbert et al. | |
| 5,724,003 A | 3/1998 | Jensen et al. | |
| 5,790,943 A | 8/1998 | Fotowat-Ahmady et al. | |
| 5,815,039 A | 9/1998 | Kimura | |
| 5,883,539 A * | 3/1999 | Kimura | G06G 7/24 327/120 |
| 5,925,095 A | 7/1999 | Kimura | |
| 5,933,054 A | 8/1999 | Kimura | |
| 5,936,465 A | 8/1999 | Kimura | |
| 5,986,494 A * | 11/1999 | Kimura | G06G 7/163 327/119 |
| 6,098,463 A | 8/2000 | Goldberg | |
| 6,291,984 B1 | 9/2001 | Wong et al. | |
| 6,437,630 B1 | 8/2002 | Gilbert | |
| 7,171,002 B2 | 1/2007 | Coats et al. | |
| 7,242,779 B2 | 7/2007 | Coats et al. | |
| 7,355,478 B2 | 4/2008 | Hamparian | |
| 7,446,597 B2 * | 11/2008 | Yu | G05F 3/262 327/147 |
| 7,777,552 B1 | 8/2010 | Gilbert | |
| 8,581,574 B2 | 11/2013 | Eken et al. | |
| 2002/0024357 A1 | 2/2002 | Ratni et al. | |
| 2003/0223588 A1 | 12/2003 | Trammell et al. | |
| 2004/0251961 A1 | 12/2004 | Braithwaite | |
| 2005/0041815 A1 | 2/2005 | Trammell et al. | |
| 2005/0088230 A1 | 4/2005 | Johnson et al. | |
| 2005/0195029 A1 | 9/2005 | Cristaudo et al. | |
| 2005/0227644 A1 | 10/2005 | Maslennikov et al. | |
| 2005/0228644 A1 | 10/2005 | Wang | |
| 2008/0001669 A1 | 1/2008 | Hamparian | |
| 2008/0297256 A1 | 12/2008 | Eken et al. | |
| 2010/0097143 A1 | 4/2010 | Eken et al. | |
| 2012/0071125 A1 | 3/2012 | Eken et al. | |

FOREIGN PATENT DOCUMENTS

| | | |
|---|---|---|
| EP | 1 595 331 | 11/2005 |
| JP | H11 250168 A | 9/1999 |

OTHER PUBLICATIONS

Analog Devices, "Preliminary Technical Data Sheet ADL5502: 800 MHz to 3800 MHz Crest Factor Detector," Rev. PrD, Apr. 20, 2008, 14 pages.

Chinese Office Action dated Jul. 14, 2015 for Chinese Patent Application No. 201110275214.6 filed Sep. 16, 2011, 9 pages.

Counts, "True RMS Measurement Using the AD531," analog dialigue, vol. 7, No. 1, p. 13 (1972).

Counts, et al., "Monolithic IC RMS-to-DC Converter," analog dialogue, vol. 11, No. 2, pp. 3 and 4 (1977).

Counts et al., "Second-Generation Monolithic RMS-to-DC Converter," analog dialogue, vol. 18, No. 1, pp. 11-13 (1984).

European Search Report dated Jun. 17, 2016 for European Patent Application No. 11181290.5, 10 pages.

Gilbert, "Current-mode Circuits From a Translinear Viewpoint a Tutorial," Chap. 2, pp. 11-91, (1990).

Gilbert, "Translinear Circuits an Historical Overview," Analog Integrated Circuits and Signal Processing, 9, 95-118 (1996).

Hittite Microwave Corporation, "HMC614LP4/614LP4E—& Peak to Average Power Detector 0.1—3.9 GHz," v02, Jun. 2008, 24 pages. Available at: http://shpat.com/docs/hittite/hmc614lp4.pdf (retrieved May 19, 2016).

Klichin, et al., "Low-Cost True-MRS Chips Also Compute AC Average," analog dialigue, vol. 22, No. 1, pp. 8 and 9 (1988).

Nash, et al. "Revolutionary RF IC Performs RMS-to-DC Conversion," Microwaves & RF, pp. 140-146 (1999).

Office Action dated Aug. 10, 2015 in Taiwanese Patent Application No. 100133180, 8 pages.

Office Action dated Jan. 7, 2015 in Chinese Application No. 201110275214.6, 14 pages.

\* cited by examiner

ENVELOPE DETECTOR WITH BIPOLAR TRIPLE-TAIL CELLS

CROSS REFERENCE TO RELATED APPLICATIONS

This application is a divisional of U.S. patent application Ser. No. 13/225,904, filed Sep. 6, 2011, entitled RMS AND ENVELOPE DETECTOR, now issued as U.S. Pat. No. 9,625,498, which is a non-provisional of and claims priority from U.S. Provisional Patent Application Ser. No. 61/383,820, filed on Sep. 17, 2010, entitled RMS AND ENVELOPE DETECTOR, the disclosures of each of which are hereby incorporated by reference in their entireties.

BACKGROUND

The present application relates generally to root mean square (RMS) detectors and envelope detectors.

There are many applications in which it is desirable to measure the average power level of a radio frequency (RF) signal. For example, power measurement and control of RF signals in both the transmitting and receiving chains of modern wireless communications systems, such as cellular telephone networks, may be essential. To efficiently use the available bandwidth, the transmitted signals in these systems are modulated using complex modulation schemes such as Code Division Multiple Access (CDMA), Wideband Code Division Multiple Access (WCDMA), or Worldwide Interoperability for Microwave Access (WiMAX). These complex modulated signals have a time varying crest factor, which is defined as the peak to average power ratio of the signal. Intolerable errors can result if conventional power detectors using diode detection or successive amplification are used to measure the signal power.

Another challenge in modern wireless communication systems is improving the power efficiency of power amplifiers used in the transmit chain. Efficient use of power amplifiers is important in mobile communications systems. Improved power efficiency can provide significant benefits including lower overall operating costs. Improving the power efficiency of power amplifiers is especially difficult when high-crest factor signals (having a peak power of 10+dB more than the average power) are transmitted since the transmitter should be put in a deep back-off mode (very low average power output) to handle the linearity requirements for peak signal levels. To improve power efficiency, it is known to apply envelope tracking to the power amplifier input signal, and to use the detected envelope to vary the amplifier operation. For supplying power to the power amplifier, a variable power supply is utilized in an envelope tracking system. The input signal envelope power levels are monitored using an envelope detector, and the power that is supplied to the power amplifier is varied based on the monitored envelope levels. In particular, the supply voltage supplied to the power amplifier is varied so as to be just sufficient to reproduce the power level required by the amplifier at a given instant of time. Accordingly, at low envelope power levels, a low supply voltage is provided to the amplifier, and the full supply voltage is only provided when the maximum output envelope power is required, i.e., at the output power peaks.

RMS power detectors can precisely measure RF power independent of the modulation type (signal shape or crest-factor). Accurate RMS calculation of these complex modulation schemes requires long integration times to include the time-varying envelope in the measurement. Thus, commercially available RMS power detectors are generally not capable of providing the envelope level of the modulated signals.

Therefore, for transmitter systems, it is desirable to have a power detector that provides both average power information and input voltage envelope information.

BRIEF SUMMARY OF THE DISCLOSURE

A power detector in accordance with one or more embodiments includes a logarithmic RMS detector, a gain or attenuation element, and a linear envelope detector. The logarithmic RMS detector receives an RF input signal and detects the average power level of the RF input signal. The gain or attenuation element also receives the RF input signal and generates an amplified or attenuated version of the RF input signal. The linear envelope detector receives the amplified or attenuated version of the RF input signal and detects the voltage envelope of the RF input signal, wherein the gain or attenuation element can generate a selected amplified or attenuated version of the RF input signal to shift the operating range of the envelope detector to higher or lower power levels.

A method of detecting power of an RF input signal in accordance with one or more embodiments comprises the steps of detecting the average power level of an RF input signal using a logarithmic RMS detector; generating an amplified or attenuated version of the RF input signal; and detecting the voltage envelope of the RF input signal using the amplified or attenuated version of the RF input signal, wherein the amplified or attenuated version of the RF input signal is selectively generated to shift the operating range of the envelope detector to higher or lower power levels.

A power detector in accordance with one or more embodiments includes a logarithmic RMS detector and a linear envelope detector. The logarithmic RMS detector receives an RF input signal and detects the average power level of the RF input signal. The logarithmic RMS detector includes a series of gain or attenuation stages that progressively amplify or attenuate the RF input signal. The logarithmic RMS detector also includes a plurality of mean square detectors, at least some of which are driven with amplified or attenuated versions of the RF input signal from the series of gain or attenuation stages. The linear envelope detector detects the voltage envelope of the RF input signal. The envelope detector is selectively coupled to an RF input for receiving the RF input signal or to one of a plurality of gain or attenuation taps of the series of gain or attenuation stages of the RMS detector for receiving an amplified or attenuated version of the RF input signal to shift the operating range of the envelope detector.

A method of detecting power in accordance with one or more embodiments comprises the steps of progressively amplifying or attenuating an RF input signal to generate a plurality of amplified or attenuated versions of the RF input signal; detecting the average power level of the RF input signal using a logarithmic RMS detector including a plurality of mean square detectors, at least some of which are driven with the plurality of amplified or attenuated versions of the RF input signal; and detecting the voltage envelope of the RF input signal using a linear envelope detector receiving the RF input signal or one of the plurality of amplified or attenuated versions of the RF input signal selected to shift the operating range of the envelope detector.

A linear envelope detector for detecting the voltage envelope of an RF input signal in accordance with one or more embodiments comprises a plurality of bipolar triple-tail cells. Each triple-tail cell includes two differential transistors and a center transistor. In each triple-tail cell, each of the transistors has a common emitter node coupled to a current source generating a tail-current. The collectors of the differential transistors of each triple-tail cell are coupled together to form an output of the envelope detector. In each triple-tail cell, a differential input voltage is applied between the bases of the differential transistors with a DC voltage component, and an input voltage with only the DC voltage component is applied to the base of the center transistor.

A linear envelope detector for detecting the voltage envelope of an RF input signal in accordance with one or more embodiments comprises a plurality of bipolar triple-tail cells. Each triple-tail cell includes two differential transistors and a center transistor. In each triple-tail cell, each of the transistors has a common emitter node coupled to a current source generating a tail-current. The collectors of the differential transistors of each triple-tail cell are coupled together to form an output of the envelope detector. In each triple-tail cell, a first signal is applied between the bases of a first one of the two differential transistors and the center transistor and a second signal is applied between the bases of a second one of the differential transistors and the center transistor, wherein the first and the second signals form a differential signal.

A linear envelope detector for detecting the voltage envelope of an RF input signal in accordance with one or more embodiments comprises a plurality of bipolar triple-tail cells. Each triple-tail cell includes two differential transistors and a center transistor. In each triple-tail cell, each of the transistors has a common emitter node coupled to a current source generating a tail-current. The collectors of the differential transistors of each triple-tail cell are coupled together to form an output of the envelope detector. In each triple-tail cell, a differential input voltage is applied between the bases of the differential transistors with a DC voltage component, and an input voltage with a parasitic RF component is applied to the base of the center transistor.

Various embodiments of the invention are provided in the following detailed description. As will be realized, the invention is capable of other and different embodiments, and its several details may be capable of modifications in various respects, all without departing from the invention. Accordingly, the drawings and description are to be regarded as illustrative in nature and not in a restrictive or limiting sense, with the scope of the application being indicated in the claims.

BRIEF DESCRIPTION OF THE DRAWINGS

Like or identical reference numbers are used to identify common or similar elements.

DETAILED DESCRIPTION

Figure 1:
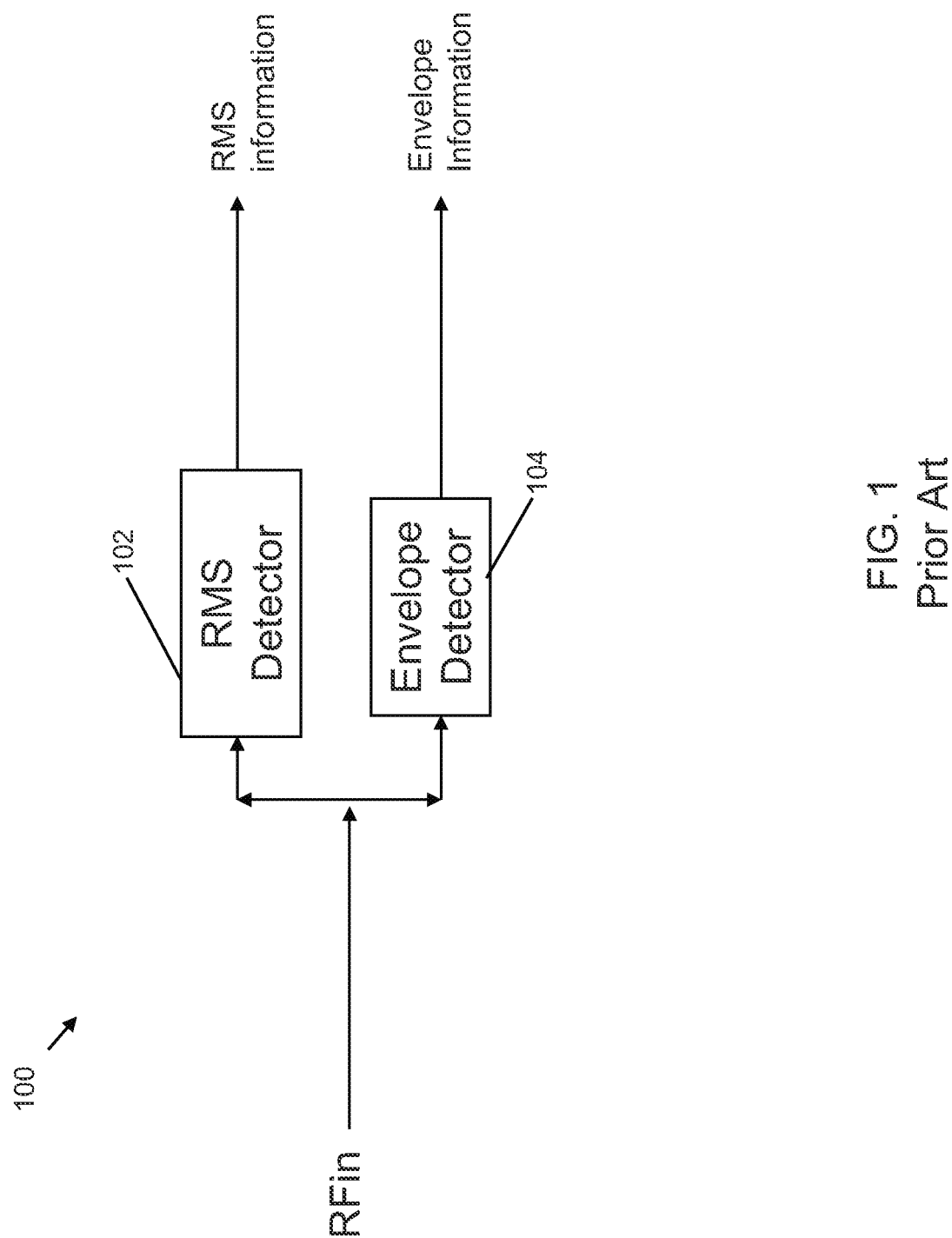
FIG. 1 is a schematic diagram of a prior art RMS and envelope detector.

FIG. 1 is a schematic block diagram illustrating a prior art RMS and envelope detector 100, which uses two separate chips 102, 104 to detect the average power and the envelope of the signal of interest in parallel. This parallel processing RF detector technique disadvantageously requires an RF coupler at the input to drive both the average power detection channel and the envelope detection channel. In addition, such a multi-chip implementation can suffer from part-to-part variations, which can occur in integrated circuits and cause intolerable measurement mismatches between the RMS detector 102 and the envelope detector 104. Discrete implementation of RMS and envelope detection also generally requires a larger board area to accommodate both chips and required interface circuitry such as an input coupler.

Figure 2:
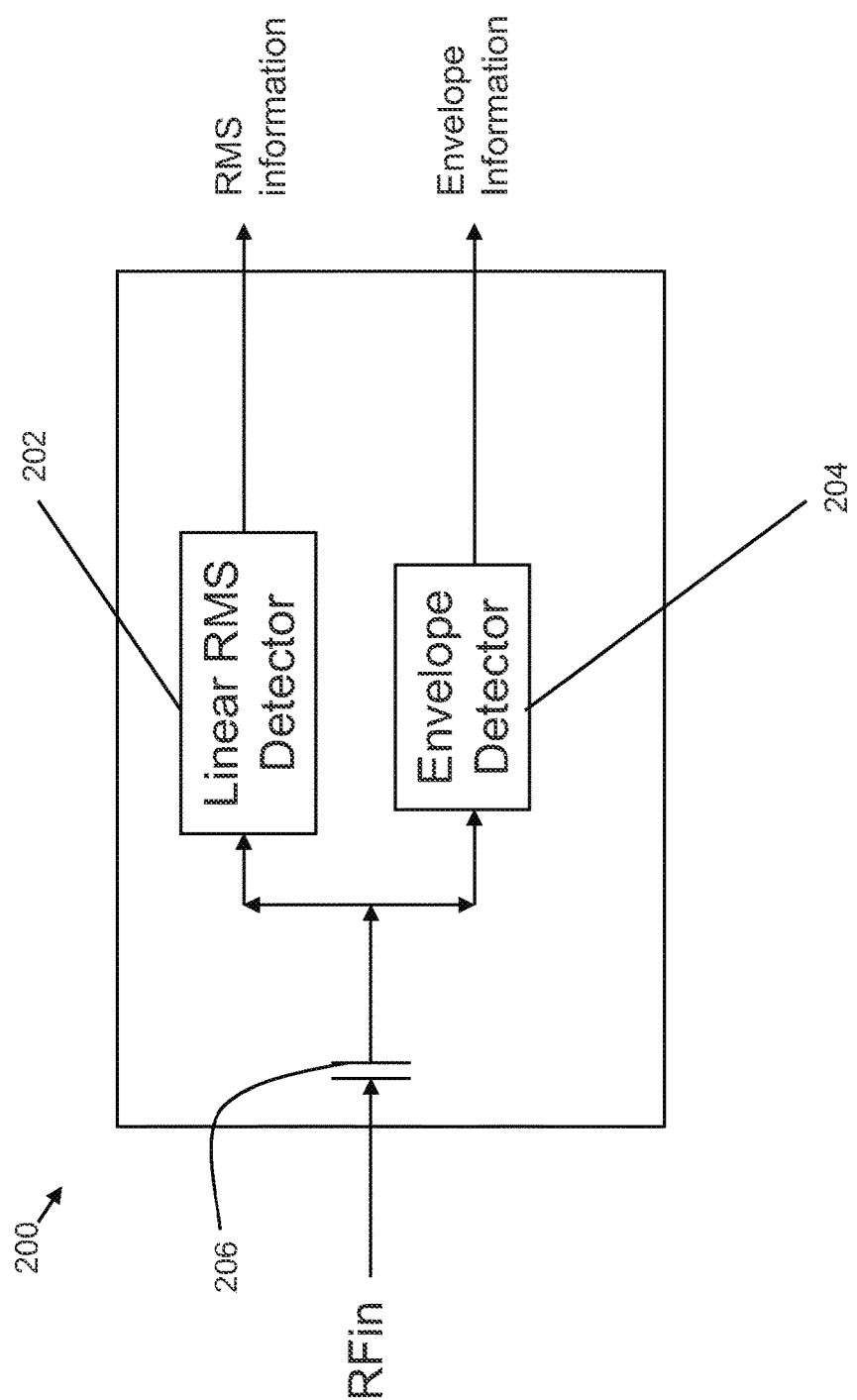
FIG. 2 is a schematic diagram of another prior art RMS and envelope detector.

FIG. 2 is a block diagram of a prior art single package power detector 200 providing both the envelope and RMS power information. The RF input is provided to separate RMS detector and envelope detector blocks 202, 204 through a DC decoupling capacitor 206. The RMS detector 202 is of linear type (Vout~Sqrt(Mean(Vin$^2$))), meaning that the output voltage changes exponentially for dB changes in the input power. For these type of detectors, especially at lower power levels (e.g., less than −10 dBm), the detected voltage level is very sensitive to mismatches and environmental variations such as temperature, and this limits the minimum detectable signal levels to about −15 dBm. The envelope detector 204 also has similar limitations, resulting in a detectable input power range of about −15 dBm to 10 dBm for both detectors. Although the simplicity of this approach may result in a smaller package size and lower power dissipation, the prior art detector 200 is only useful for a limited level of input signals. Also, a linear RMS detector output is usually not preferable in power control applications because of larger reading errors for low input power levels.

Figure 3:
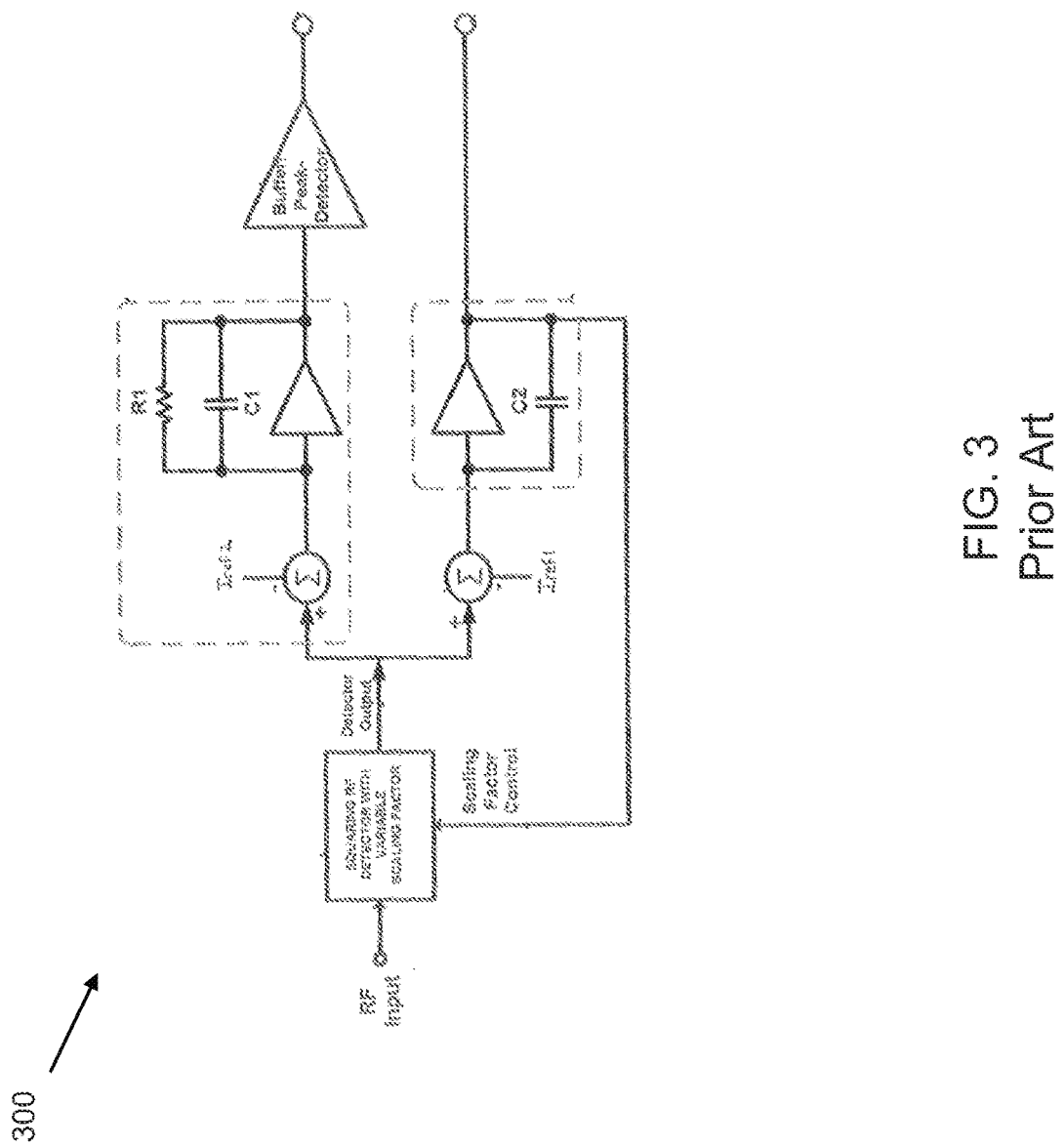
FIG. 3 is a schematic diagram of another prior art RMS and envelope detector.

FIG. 3 illustrates another prior art power detector 300 providing both envelope and RMS power information. The detector 300 uses a servo feedback type RMS detection architecture for high dynamic range operation. The detector can detect signal levels down to −70 dBm, giving it a significantly higher dynamic range than linear type RMS detectors.

The envelope detection channel receives its input from an internal point of the servo feedback loop and this buffered internal point provides the power envelope of the input signal that is normalized to the average power level of the input signal. This architecture provides a high dynamic range for both RMS and envelope detection (the envelope detection dynamic range is equivalent to the RMS detection range—more than 70 dB possible) with exceptional repeatability (over temperature and process variations) as well as exceptional matching between the RMS power reading and power envelope reading. Most envelope tracking applications, however, require the envelope detector to track the voltage envelope of the input signal instead of the power envelope, and this type of architecture may accordingly not be suitable because it tracks the power envelope.

Figure 4:
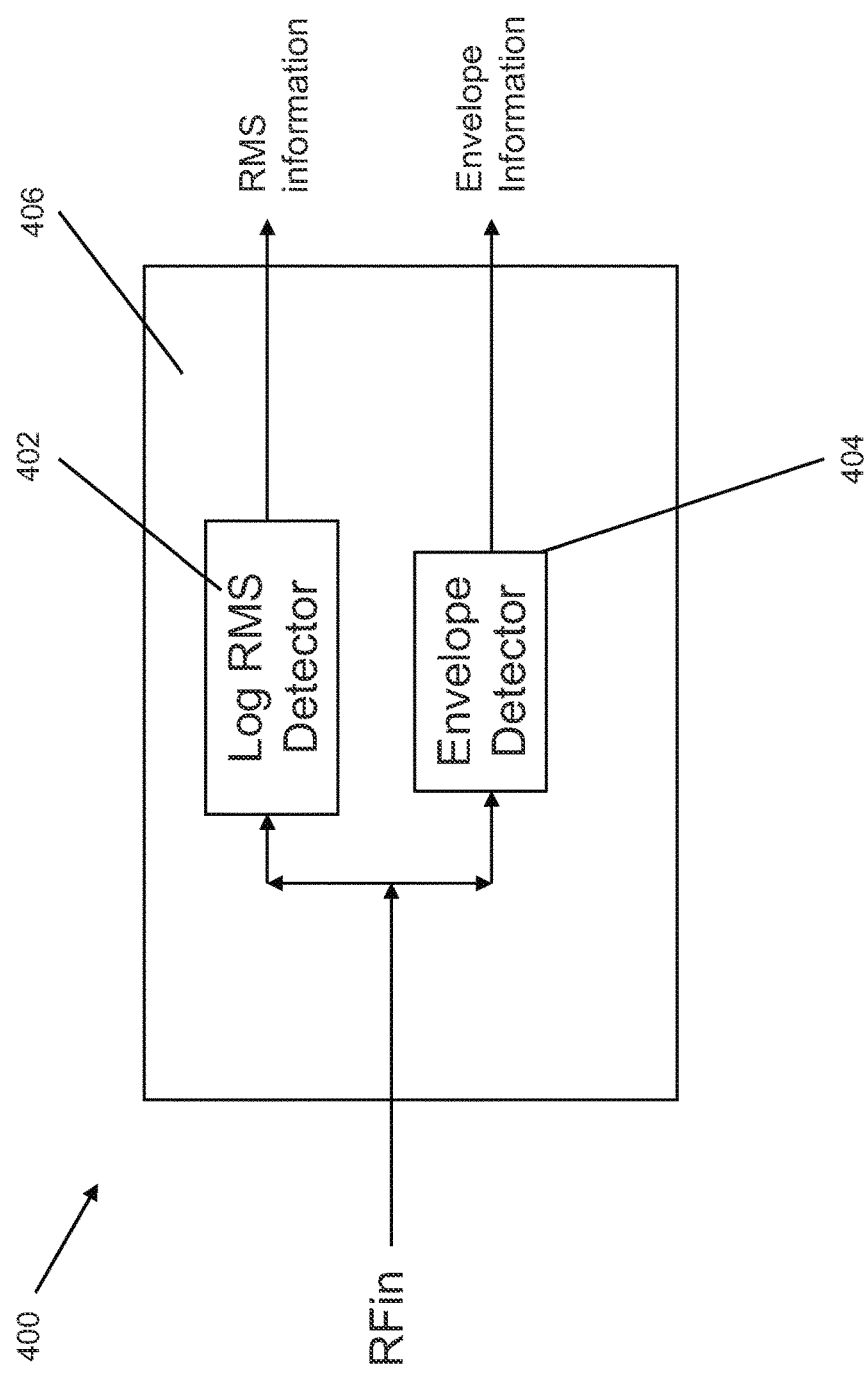
FIG. 4 is a schematic diagram of an RMS and envelope detector in accordance with one or more embodiments.

FIG. 4 is a block diagram illustrating a single package power detector 400 providing both envelope and RMS power information in accordance with one or more embodiments of the invention. An RF input is coupled to separate RMS detector and envelope detector blocks 402, 404, which process the input signal separately. The RMS detector 402 and the envelope detector 404 are provided in a single package 406 and preferably on a single die.

The RMS detector 402 is a logarithmic type (Vout~Log (Mean(Vin$^2$))) RMS detector, in which the output voltage changes linearly for dB changes in the input power. Logarithmic RMS detectors provide significantly larger input dynamic ranges compared to linear RMS detector types. They are especially useful for power/gain control applications because they have linear-in-dB characteristics and provide higher accuracy at low power levels (e.g., detection down to −70 dBm is possible).

With direct coupling of the RF input signal to the envelope detector, the envelope detection dynamic range is lower (limited to about −15 dBm at low power end and +10 dBm at the top end).

Figure 5:
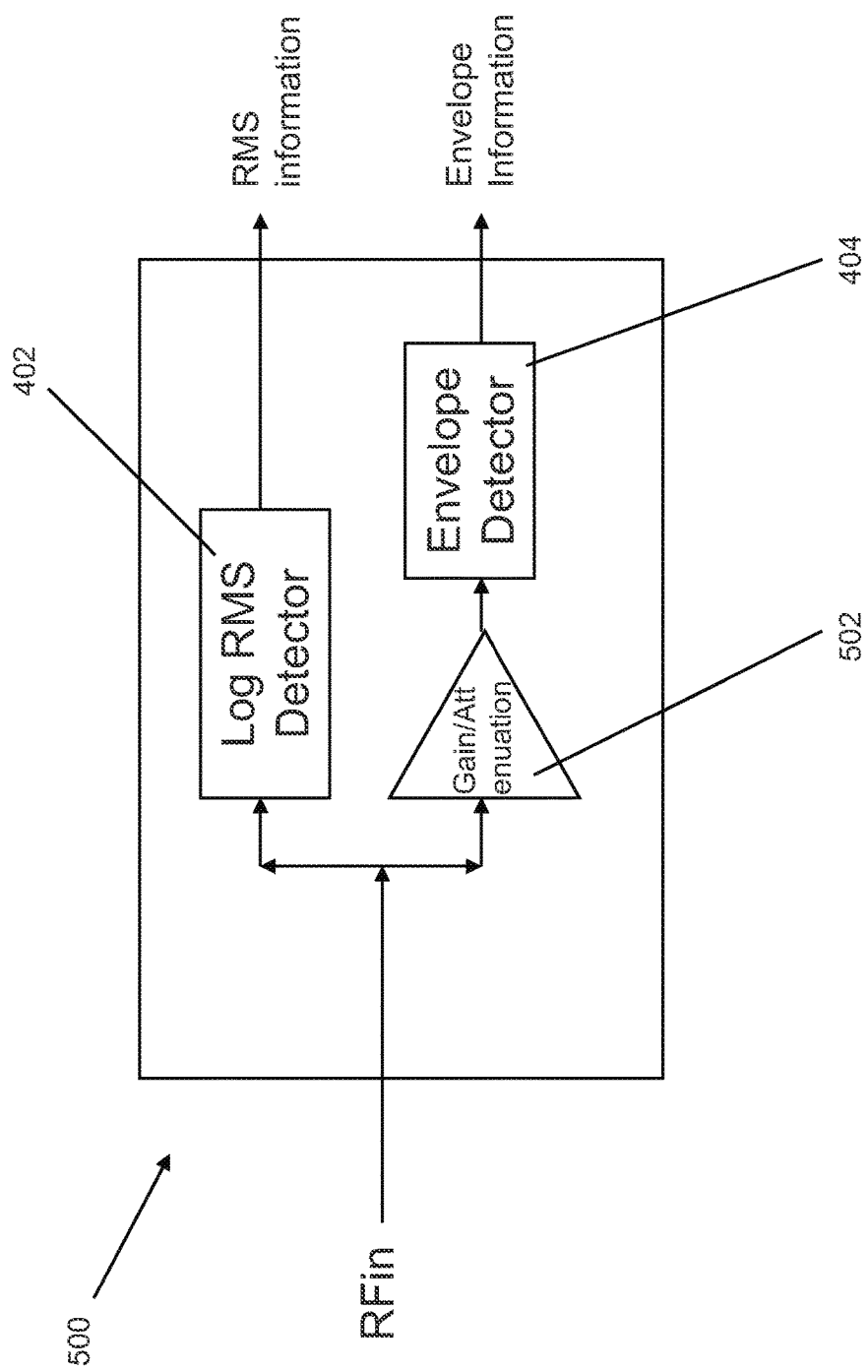
FIG. 5 is a schematic diagram of an RMS and envelope detector in accordance with one or more further embodiments.

FIG. 5 is a block diagram of an RMS and envelope detector 500 in accordance with one or more further embodiments. The detector 500 is similar to the detector 400 shown in FIG. 4, and further includes a gain/attenuation block 502. In the FIG. 5 embodiment, the RF input is coupled to the gain/attenuation block 502 to provide amplification/attenuation to the input signal. The output of the gain/attenuation block is coupled to the envelope detector 404. The operating range of the envelope detector 404 (the range of input signals to which the envelope detector accurately responds) can be shifted to lower or higher power levels. For example, for a gain of 20 dB in the gain/attenuation block 502, the envelope detector 404 can detect RF signals from about −35 dBm to −10 dBm.

Figure 6:
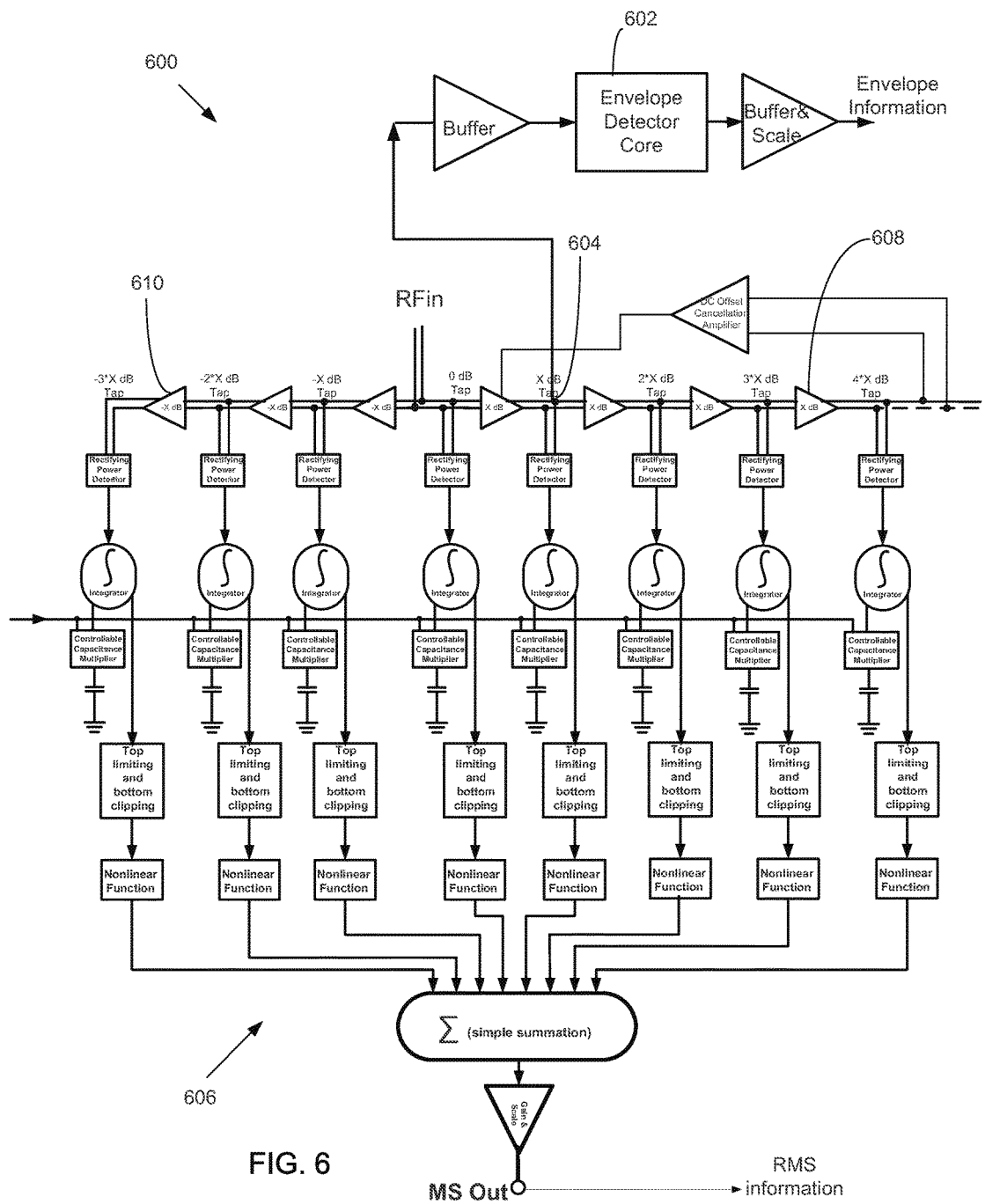
FIG. 6 is a schematic diagram of an RMS and envelope detector in accordance with one or more further embodiments.

FIG. 6 is a block diagram of an RMS and envelope detector 600 in accordance with one or more further embodiments of the invention. In this embodiment, an envelope detector core 602 is coupled to one of a plurality of gain/attenuation taps 604 of an RMS detector 606.

In this embodiment, the RMS detector 606 includes a plurality of mean square detectors, some of which are driven with amplified or attenuated versions of an RF input signal to obtain a wider range of mean square power detection than a single mean square detector. The amplified or attenuated versions of the RF input signal are obtained by using a series of gain or attenuation operations that progressively amplify or attenuate the RF input signal using amplifiers 608 or attenuators 610.

The operating range of the envelope detector 602 (the range of input signals that the envelope detector accurately responds to) can be shifted to lower or higher power levels similar to the FIG. 5 embodiment. However, in the FIG. 6 embodiment, there is no need for additional amplification/attenuation because the amplified/attenuated taps of RMS detector 606 can be used to supply the needed gain/attenuation. For gain/attenuation separation of 7 dB, the envelope detector operation range can be shifted in 7 dB steps. For example, if the envelope detector 602 is coupled to the 3rd gain tap of the architecture (21 dB gain from input), the envelope detector 602 can detect RF signals from −36 dBm to −11 dBm assuming that the envelope detector has 25 dB detection range.

Figure 7:
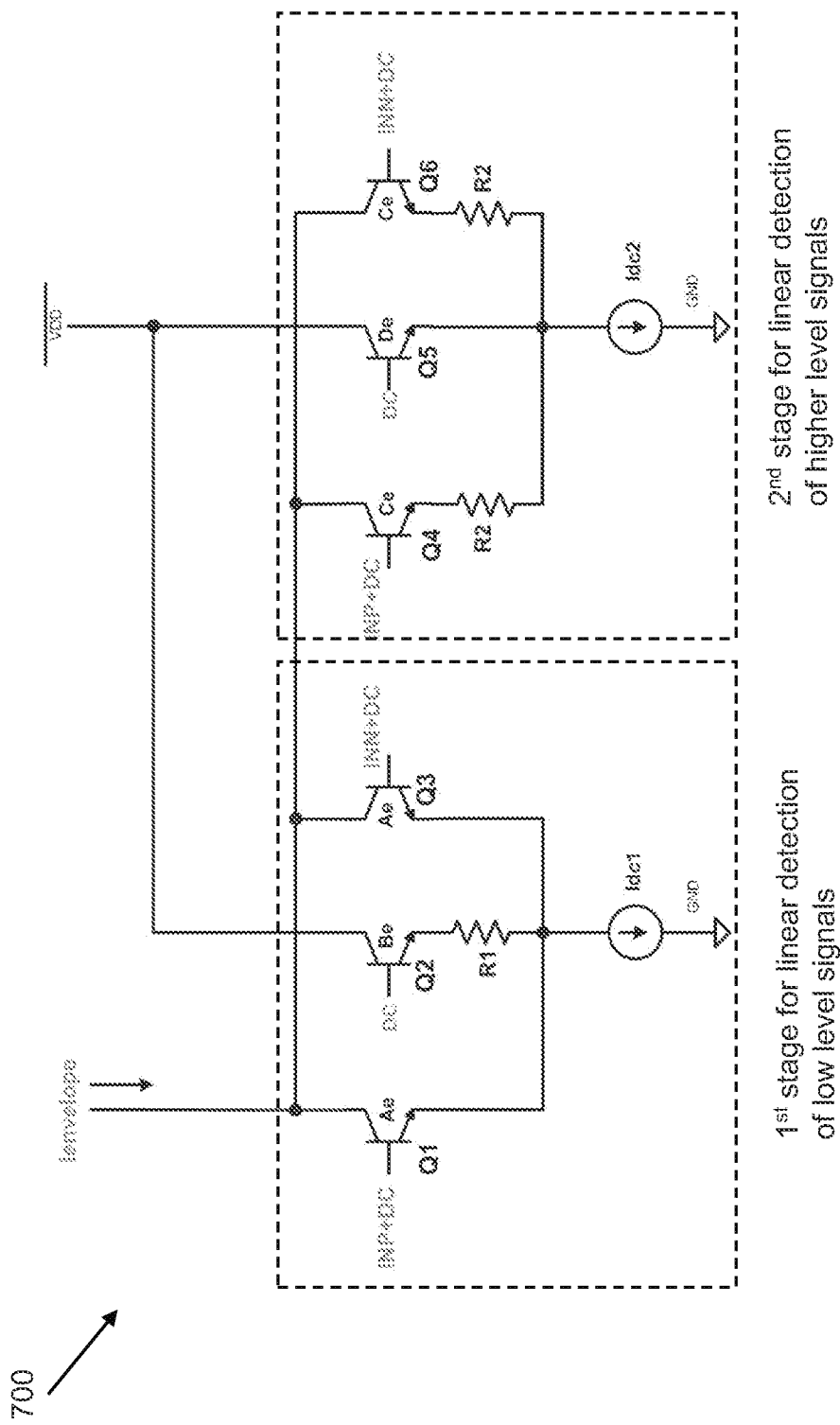
FIG. 7 is a schematic diagram of an envelope detector core structure in accordance with one or more embodiments.

FIG. 7 schematically illustrates an envelope detector core structure 700 in accordance with one or more embodiments that can be used for envelope detection, e.g., in the various RMS and envelope detectors described herein. The detector comprises a plurality of bipolar triple-tail cells (indicated in the FIG. 7 example as the 1st stage and 2nd stage). Each triple-tail cell includes three emitter-coupled npn bipolar transistors (Q1, Q2, Q3 in the first stage, Q4, Q5, Q6 in the second stage) and a current source coupled to the common-emitter generating a tail-current Idc1, Idc2. The transistors Q1 and Q3 of the first stage form a differential pair with emitter areas equal to each other (Ae). The transistors Q4 and Q6 of the second stage form a differential pair with emitter areas equal to each other (Ce). The transistors Q2 and Q5 may have different emitter areas (Be and De, respectively) than their respective differential pairs. The ratios B/A or D/C may be unity, or may be greater or less than unity. The collectors of the transistors Q1 and Q3 of the first stage are coupled together forming the output terminal of an envelope detector core stage, while the collector of Q2 is coupled to an AC ground. Similarly, the collectors of the transistors Q4 and Q6 of the second stage are coupled together forming the output terminal of an envelope detector core stage, while the collector of Q5 is coupled to an AC ground.

In this configuration, a differential input voltage Vinp=INP−INN is applied between the bases of the transistors Q1, Q3 and Q4, Q6 with a dc voltage component denoted as "DC". The bases of the center transistors Q2 and Q5 receive only the dc component "DC". In an alternative embodiment, the center transistors may receive a parasitic RF component. In a further embodiment, one of the transistors in the differential pair Q1, Q3 or Q4, Q6 can receive a DC voltage at its base and the other two transistors (one of Q1, Q3 and also Q2, or one of Q4, Q6 and also Q5) can receive input signals that effectively generate a differential voltage across base inputs of Q1−Q2=Q4−Q5 (=Vinp/2) and Q3−Q2=Q6−Q5 (=−Vinp/2).

Figure 8:
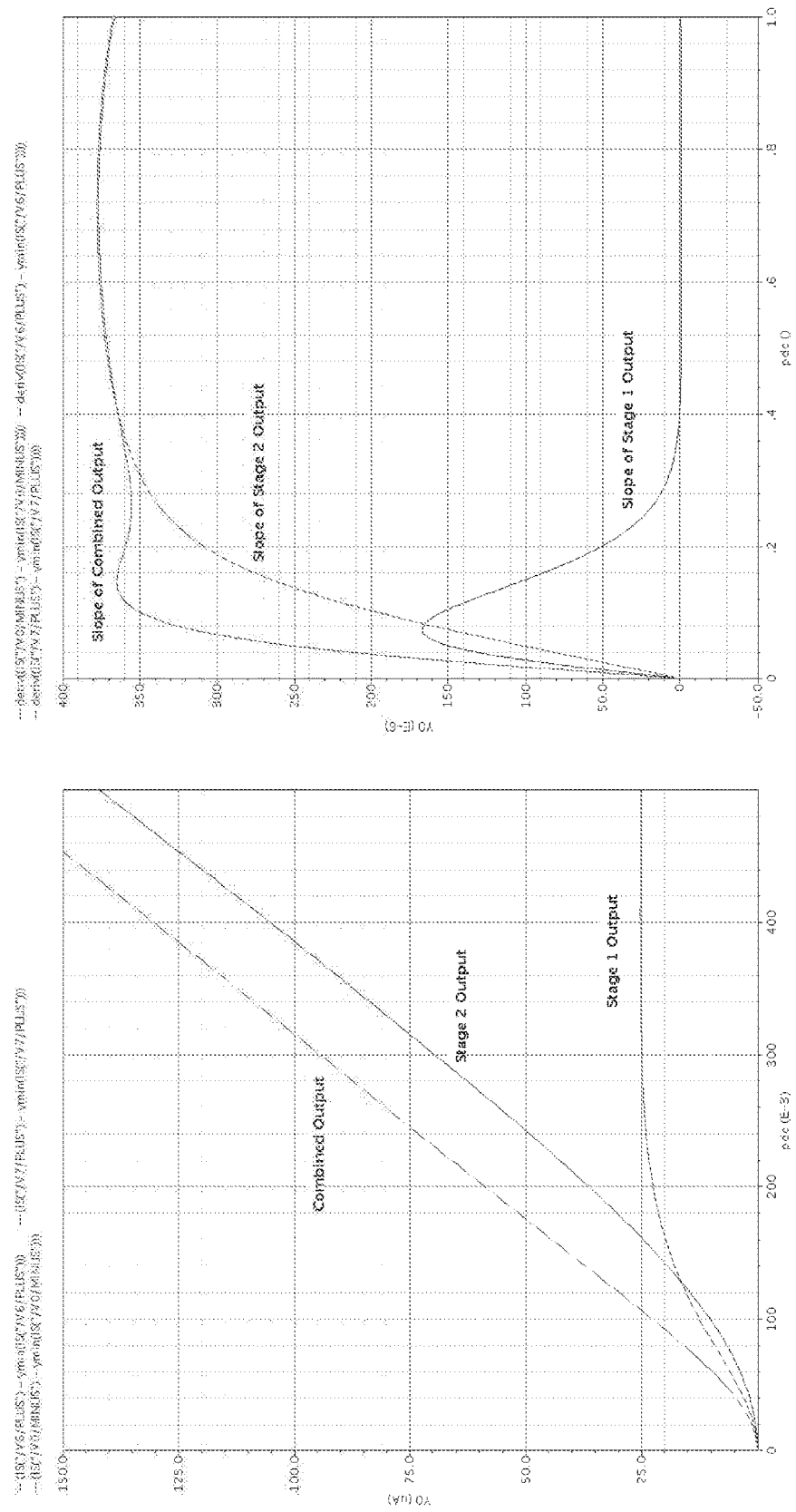
FIG. 8 is a graph illustrating exemplary output-input characteristics of triple-tail cells.

In the embodiment illustrated in FIG. 7, two types of triple-tail cells are used in the envelope detector core (1st stage=type-1, 2nd stage=type-2). The type-2 stage uses two emitter degeneration resistors R2 that are coupled between the emitter of the differential pair transistors Q4, Q6 and the common emitter node (which is coupled to the current source). The degeneration resistors linearize the output-input transfer curve of the stage for mid and high level input signals when used with a proper D/C ratio (preferably D/C>>1 in the current embodiment). The type-1 stage, on the other hand, uses a single emitter degeneration resistor R1 that is coupled between the emitter of the center transistor Q2 and the common emitter node. The degeneration resistor linearizes the output-input transfer curve of the combined structure (including both type-1 and type-2 stages) for lower input signal levels with a proper B/A ratio (preferably B/A<1 in the current embodiment). In summary, emitter degeneration resistors R1 and R2 expand the linear operating input voltage range of the envelope detector core. FIG. 8 shows an example of the output-input characteristics of the type-1 and type-2 stages as well as the combined structure. As shown, the type-2 stage provides approximately linear characteristics for input signal levels of Vinp>150 mV, while the combined structure provides approximately linear characteristics for input signal levels of Vinp>50 mV, resulting in a significant improvement in the dynamic range.

It should be noted that additional Type-2 stages can be provided in parallel with different degeneration values and D/C ratios to further increase the dynamic range for higher signal levels.

It is to be understood that although the invention has been described above in terms of particular embodiments, the foregoing embodiments are provided as illustrative only, and do not limit or define the scope of the invention. Various other embodiments, including but not limited to the following, are also within the scope of the claims. For example, elements and components described herein may be further divided into additional components or joined together to form fewer components for performing the same functions.

What is claimed is:

1. An envelope detector with improved dynamic range, the envelope detector comprising:
   a first bipolar triple-tail cell comprising first differential bipolar transistors, a first additional bipolar transistor having an emitter coupled to emitters of the first differential bipolar transistors at a first common node, and a single degeneration resistor, wherein the single degeneration resistor is coupled between the emitter of the first additional bipolar transistor and the first common node; and
   a second bipolar triple-tail cell comprising second differential bipolar transistors, a second additional bipolar transistor having an emitter coupled to emitters of the second differential bipolar transistors at a second common node, and a respective degeneration resistor coupled between the emitter of each of the second differential bipolar transistors and the second common node;
   wherein the envelope detector is configured to receive the radio frequency input signal and to detect an envelope of the radio frequency input signal, and wherein collectors of the first differential bipolar transistors and collectors of the second differential bipolar transistors are coupled together and provide an output of the envelope detector.

2. The envelope detector of claim 1, wherein the first bipolar triple-tail cell is configured to provide approximately linear characteristics for a first range of signal levels of a radio frequency input signal, the second bipolar triple-tail cell is configured to provide approximately linear characteristics for a second range of signal levels of the radio frequency input signal, and the second range is above the first range.

3. The envelope detector of claim 1, further comprising a current source configured to provide a tail current to the first common node.

4. The envelope detector of claim 3, further comprising a second current source configured to provide a second tail current to the second common node.

5. The envelope detector of claim 1, wherein the second bipolar triple-tail cell does not include a degeneration resistor coupled between the second common node and the emitter of the second additional bipolar transistor.

6. The envelope detector of claim 1, wherein the first differential bipolar transistors and the first additional bipolar transistor each comprises an NPN transistor.

7. The envelope detector of claim 1, wherein bases of the first differential bipolar transistors are configured to receive a differential input voltage comprising a direct current voltage component, and wherein a base of the first additional bipolar transistor is configured to receive an input voltage with only the direct current voltage component.

8. The envelope detector of claim 1, wherein bases of the first differential bipolar transistors are configured to receive a differential input voltage comprising a direct current voltage component, and wherein a base of the first additional bipolar transistor is configured to receive an input voltage comprising a parasitic radio frequency component.

9. The envelope detector of claim 1, wherein the envelope detector is configured to receive a first signal between the bases of a first one of the first differential bipolar transistors and the first additional bipolar transistor and to receive a second signal the bases of a second one of the first differential bipolar transistors and the first additional bipolar transistor, wherein the first signal and the second signal form a differential signal.

10. An envelope detector with improved dynamic range, the envelope detector comprising:
    a first triple-tail cell comprising first differential transistors, a first center transistor, and a first degeneration resistor coupled between the first center transistor and a first common node at which the first differential transistors and the first center transistor are coupled to each other, wherein the first triple-tail cell is configured to provide approximately linear characteristics for a first range of signal levels of a radio frequency input signal; and
    a second triple-tail cell coupled to the first triple-tail cell, the second triple-tail cell comprising second differential transistors, a second center transistor, and respective second degeneration resistors coupled between respective transistors of the second differential transistors and a second common node at which the second differential transistors and the second center transistor are coupled to each other, wherein the second triple-tail cell is configured to provide approximately linear characteristics for a second range of signal levels of the radio frequency input signal, and wherein the second range is above the first range,
    wherein the envelope detector is configured to receive the radio frequency input signal and to detect an envelope of the radio frequency input signal.

11. The envelope detector of claim 10, further comprising:
    a first current source configured to provide a first tail current to the first common node; and
    a second current source configured to provide a second tail current to the second differential transistors and the second center transistor.

12. The envelope detector of claim 10, wherein the first differential transistors each comprise a respective collector, the second differential transistors each comprise a respective collector, and the collectors of the first differential transistors and the second differential transistors are coupled to each other.

13. The envelope detector of claim 10, wherein the first triple-tail cell comprises a single degeneration resistor, and the single degeneration resistor is the first degeneration resistor.

14. The envelope detector of claim 13, wherein degeneration resistors of the second triple-tail cell consist of the respective second degeneration resistors.

15. The envelope detector of claim 10, wherein the first differential transistors and the first center transistor each comprise a respective emitter coupled to the first common node.

16. The envelope detector of claim 10, wherein the first center transistor and the second center transistor are configured to receive the same signal.

17. A method of detecting an envelope with improved dynamic range, the method comprising:
    receiving an input signal at an input of an envelope detector, the envelope detector comprising a first bipolar triple-tail cell and a second bipolar triple-tail cell;
    linearizing, with a single degeneration resistor of the first bipolar triple-tail cell coupled between an emitter of a center transistor of the first bipolar triple-tail cell and a common emitter node of the first bipolar triple-tail cell, an output-input transfer function of the envelope detector for the input signal having a first signal level in a first range; and linearizing, with a pair of degeneration resistors of the second bipolar triple-tail cell coupled between respective emitters of respective differential transistors of the second bipolar triple-tail cell and a common emitter node of the second bipolar triple-tail cell, the output-input transfer function of the envelope detector for the input signal having a second signal level in a second range, wherein the second range is above the first range.

18. The method of claim 17, further comprising:
applying a first signal between bases of a first one of the differential transistors and a center transistor of the second bipolar triple-tail cell; and
applying a second signal between bases of a second one of the differential transistors and the center transistor of the second bipolar triple-tail cell, wherein the first signal and the second signal form a differential signal.

19. The method of claim 17, further comprising:
applying, with a direct current voltage component, a differential input voltage between bases of the differential transistors of the second bipolar triple-tail cell, wherein the input signal is a radio frequency signal; and
applying an input voltage with a parasitic radio frequency component to a base of a center transistor of the second bipolar triple-tail cell.

20. The method of claim 17, further comprising:
applying, with a direct current voltage component, a differential input voltage between bases of the differential transistors of the second bipolar triple-tail cell, wherein the input signal is a radio frequency signal; and
applying an input voltage with only the direct current voltage component to a base of a center transistor of the second bipolar triple-tail cell.

* * * * *